United States Patent
Werner et al.

[11] Patent Number: 5,976,948
[45] Date of Patent: Nov. 2, 1999

[54] PROCESS FOR FORMING AN ISOLATION REGION WITH TRENCH CAP

[75] Inventors: Thomas Werner; Robert Dawson, both of Austin, Tex.

[73] Assignee: Advanced Micro Devices, Austin, Tex.

[21] Appl. No.: 09/026,285

[22] Filed: Feb. 19, 1998

[51] Int. Cl.$^6$ .................................................. H01L 21/76
[52] U.S. Cl. ....................... 438/424; 438/435; 438/437; 148/DIG. 50
[58] Field of Search ................................. 438/424, 427, 438/433, 435, 437; 148/DIG. 50

[56] References Cited

U.S. PATENT DOCUMENTS

| | | | |
|---|---|---|---|
| 5,712,185 | 1/1998 | Tsai et al. | 438/424 |
| 5,766,823 | 6/1998 | Fumitomo | 438/437 |
| 5,801,083 | 9/1998 | Yu et al. | 148/DIG. 50 |
| 5,834,358 | 11/1998 | Pan et al. | 438/424 |
| 5,895,254 | 4/1999 | Huang et al. | 438/424 |

OTHER PUBLICATIONS

Wolf, S., *Silicon Processing for the VLSI Era, Vol. 2—Process Integration*, ©1990, Lattice Press, Sunset Beach, California 90742; pp. 28–58.

U.S. application ser. No. 08/993,756, filed Dec. 18, 1997.

*Primary Examiner*—Trung Dang
*Attorney, Agent, or Firm*—Merchant & Gould P.C.

[57] ABSTRACT

A method for producing a semiconductor device using an improved trench isolation technique includes, first, forming a masking layer over a device layer. A first portion of the masking layer and an underlying portion of the device layer are removed to form at least one trench. A second portion of the masking layer is then selectively removed from a region adjacent the trench and above the device layer. A dielectric layer is formed in the trench so that the dielectric layer at least partially fills the trench and the region adjacent to the trench and above the device layer. The dielectric layer includes a trench cap above the trench isolation region and the device layer. The trench cap extends laterally and longitudinally above and beyond the trench isolation region, in accordance with the second portion of the masking layer which was removed. This enlarged trench cap permits the removal of a portion of the dielectric material from the trench cap during subsequent processing without the consequent formation of substantial voids between the dielectric material in the trench and the device layer.

20 Claims, 4 Drawing Sheets

PROCESS FOR FORMING AN ISOLATION REGION WITH TRENCH CAP

FIELD OF THE INVENTION

The present invention is, in general, directed to a method for making a semiconductor device having trench isolation regions. More particularly, the present invention relates to a method for making a semiconductor device with an isolation region having a trench cap which extends laterally away from the trench.

BACKGROUND OF THE INVENTION

Over the last few decades, the electronics industry has undergone a revolution by the use of semiconductor technology to fabricate small, highly integrated electronic devices. The most common semiconductor technology presently used is silicon-based. A large variety of semiconductor devices have been manufactured having various applications in numerous disciplines. Such silicon-based semiconductor devices often include metal-oxide-semiconductor (MOS) transistors, complimentary MOS (CMOS) transistors, bipolar transistors, bipolar CMOS (BiCMOS) transistors, etc.

Each of these semiconductor devices generally include a semiconductor substrate on which a number of active devices are formed. The particular structure of a given active device can vary between device types. For example, in MOS transistors, an active device generally includes source and drain regions and a gate electrode which modulates current between the source and drain regions. In bipolar transistors, an active device generally includes a base, a collector, and an emitter.

Semiconductor devices, like the ones mentioned above, are used in large numbers to construct most modern electronic devices. As a larger number of such devices are integrated into a single silicon wafer, improved performance and capabilities of electronic devices can be achieved. In order to increase the number of semiconductor devices which may be formed on a given surface area of a substrate, the semiconductor devices must be scaled down (i.e., made smaller). This is accomplished by reducing the lateral and vertical dimensions of the device structure.

One important step in the formation of semiconductors is the process of forming isolation regions, i.e., regions in the substrate which are used to electrically isolate adjacent active devices. Two common techniques for isolating active devices on a semiconductor substrate are LOCOS (for LOCal Oxidation of Silicon) isolation and trench isolation. Trench isolation techniques, and many LOCOS isolation techniques, generally involve the formation of a trench in the substrate. In most cases, an oxide layer is grown in the trench to form at least part of the isolation region. In trench isolation, a second layer of oxide may be deposited over the grown oxide layer to completely fill the trench.

The isolation region resulting from trench isolation techniques (and those LOCOS isolation techniques which involve trenches) is often associated with a number of limitations. For example, the sidewalls of the isolation region are often etched away during subsequent processing steps, resulting in voids at the edges of the trench. Such voids impact device parameters by, for example, increasing the non-uniformity of those parameters. This problem becomes more significant as devices become smaller and trenches become shallower. A more detailed discussion of LOCOS and trench isolation techniques can be found in S. Wolf, *Silicon Processing For The VLSI Era*, Vol. 2: Processing Integration, Chap. 2, pp. 28–58, 1990.

SUMMARY OF THE INVENTION

Generally, the present invention relates to a method for forming a trench isolation region having a trench cap extending laterally away from the trench. The trench cap can, for example, reduce and/or eliminate voids between dielectric material in the trench isolation region and the device layer. One embodiment is a method of producing a semiconductor device. The method includes forming a masking layer over a device layer and removing a first portion of the masking layer and an underlying portion of the device layer to form at least one trench. A second portion of the masking layer is selectively removed from a region adjacent to the trench and above the device layer. A dielectric layer is formed in the trench. The dielectric layer at least partially fills the trench and the region adjacent to the trench and above the device layer.

Another embodiment is a method of isolating active regions of a semiconductor device. The method includes forming a masking layer over the device layer. A first portion of the masking layer is removed to expose an isolation region of the device layer. A remaining portion of the masking layer defines at least two active regions of the device layer. A portion of the exposed device layer is then removed to form at least one trench in the device layer between the at least two active regions. A second portion of the masking layer is selectively removed from a region adjacent to the trench and above the device layer. A dielectric layer is formed in the trench and at least partially fills the trench and the region adjacent to the trench and above the device layer. The dielectric layer also forms a trench cap which extends laterally over a portion of the device layer.

A further embodiment is a method for producing a semiconductor device. A patterned masking layer is formed exposing at least one portion of a substrate which is then etched to form a trench in the substrate. A portion of the patterned masking layer is removed to form a recess between the trench and the patterned masking layer and then at least a part of the trench and the recess are filled with a dielectric material.

Yet another embodiment is a semiconductor device made according to the methods described above.

Another embodiment is a semiconductor device which includes a device layer, a trench formed in the device layer, a dielectric material at least partially filling the trench, and a trench cap extending laterally from the trench and above the device layer. The trench cap is made from a dielectric material.

The above summary of the present invention is not intended to describe each disclosed embodiment or every implementation of the present invention. The Figures and the detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1A:
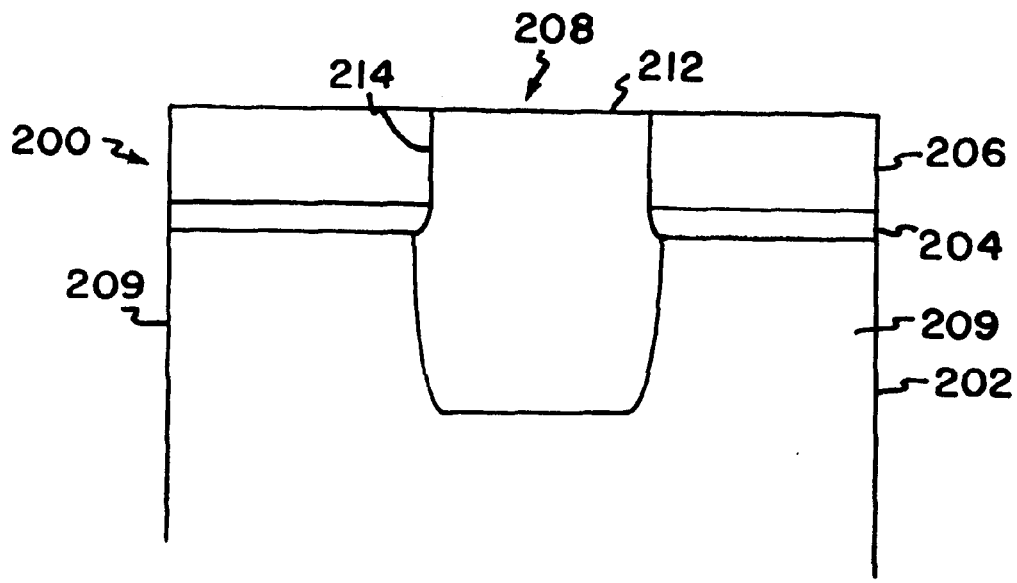
FIGS. 1A and 1B are cross sections of a semiconductor device using trench isolation of active regions immediately after filling the trench (FIG. 1A) and after subsequent processing steps (FIG. 1B)

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION OF THE DRAWINGS

The present invention is believed to be applicable to a number of different semiconductor devices, such as metal-oxide-semiconductor (MOS) transistors, complimentary MOS (CMOS) transistors, bipolar transistors, bipolar CMOS (BiCMOS) transistors, etc. In particular, the present invention is directed to semiconductor devices which utilize trench isolation between active regions. While the present invention is not so limited, an appreciation of various aspects of the invention will be gained through a discussion of the examples provided below.

Figure 1B:
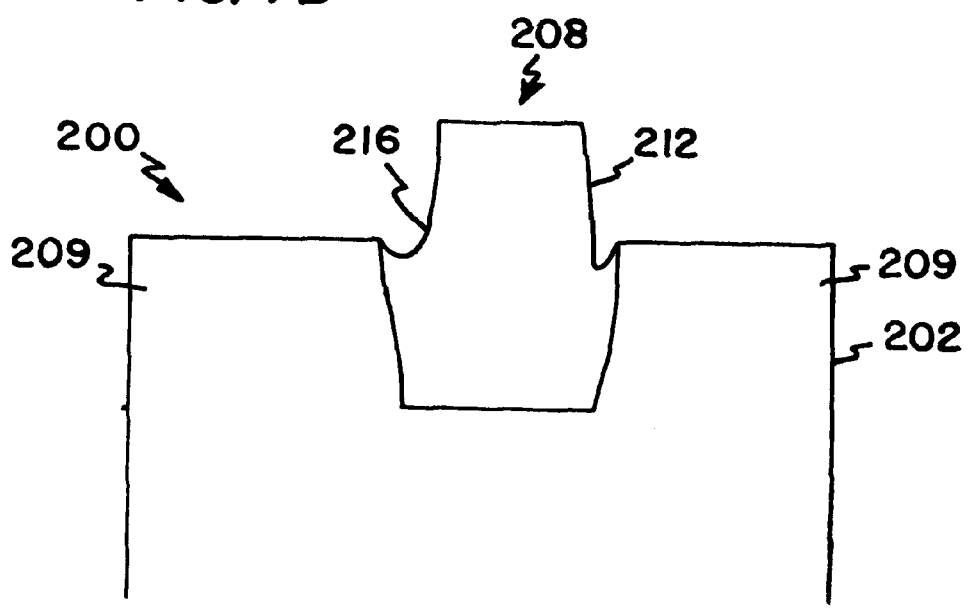

FIGS. 1A and 1B illustrate a trench isolation region 208 formed in a device layer 202 of a semiconductor device 200 using typical processing methods. The trench isolation region 208 is typically used to separate active regions 209. Initially the dielectric material 212 which fills the trench isolation region 208 has sidewalls 214, as shown in FIG. 1A. These sidewalls 214 typically correspond to the walls of the masking layer 206, barrier layer 204, and device layer 202.

However, often during one or more subsequent processing steps, a portion of the dielectric material 212 is removed which may leave voids 216 within the trench isolation region 208, as illustrated in FIG. 1B. For example, portions of the dielectric material 212 may be removed as the masking layer 206 and/or barrier layer 204 are removed. In particular, this is likely to occur, for example, if the dielectric material 212 is similar to or the same as the material of the barrier layer 204. Often both the dielectric material 212 and the barrier layer 204 are formed of an oxide material, such as silicon dioxide. Furthermore, additional portions of the dielectric material 212 may be removed during other oxidation and oxide strip processes, as well as during etching, cleaning, and silicidation processes.

The voids 216, caused by the removal of the dielectric material 212, may extend into the trench 208 leaving recesses between the device layer 202 and the dielectric material 212. Often, the size of these voids 216 is not predictable and may result in unpredictable device parameters among similarly manufactured semiconductor devices. Furthermore, chemicals or debris from subsequent processing steps may become trapped in these voids and may later cause unwanted reactions or degradation of the surrounding layers. In addition, debris or other deposited material may form bridges across the trench 208 or require a longer overetch in subsequent processing steps.

Figure 2A:
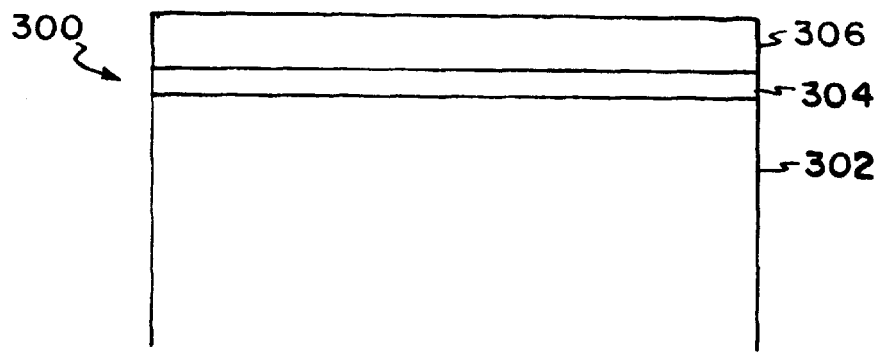
FIGS. 2A–2G illustrate an exemplary process for forming a semiconductor device in accordance with one embodiment of the invention.

FIGS. 2A–2G illustrate a process for forming a trench isolation region having a trench cap extending laterally from the trench isolation region over a portion of a device layer. The trench cap may, for example, reduce the number and size of voids formed in the trench isolation region during subsequent processing steps. In some cases, this process may eliminate the voids altogether. The process begins with the formation of a masking layer 306 over a device layer 302, as illustrated in FIG. 2A.

The device layer 302 is often the substrate of the semiconductor device 300, however, the invention is not so limited. The device layer 302 may be any other layer in the semiconductor device 300 including, for example, other semiconductor, metal, or dielectric layers of the device. If the device layer is the substrate, the device layer 302 is often formed from a material such as silicon or some other semiconductor.

The masking layer 306 is typically formed using a material which allows for selective removal of the masking layer 306 while leaving behind a subsequently deposited dielectric layer 312 (see FIGS. 2E, 2F, and 2G). The masking layer 306 may be formed, for example, using a nitride material, such as silicon nitride, particularly when the dielectric layer 312 includes an oxide material, such as silicon dioxide. The masking layer 306 may be formed by such techniques as, for example, chemical vapor deposition (CVD), physical vapor deposition, or sputtering.

The thickness of the masking layer 306 is selected to adequately protect underlying portions of the device layer 302 while taking into consideration removal of portions of the masking layer 306 in subsequent processing. For example, a part of the masking layer 306 is removed to form a trench. In accordance with the invention, another part of the masking layer 306 is removed to form a trench cap (see FIG. 2E). Suitable thicknesses of the masking layer 306 range from, for example, 300 to 3500 angstroms. To accommodate the removal of an additional portion of the masking layer during the formation of a trench cap, a thicker masking layer may be used. The thickness of the masking layer 306 may, for example, be 50 to 1500 angstroms thicker than similar masking layers (typically 500 to 2000 angstroms thick) used in conventional processes for forming trench isolation regions, such as the masking layer 206 illustrated in FIGS. 1A and 1B.

An optional barrier layer 304 may be provided between the device layer 302 and the masking layer 306, particularly if the device layer 302 and masking layer 306 are made of materials which are not compatible. For example, if the device layer 302 is formed of silicon and the masking layer 306 is formed of a nitride material, it is typically desirable to provide a barrier layer 304 between these two layers 302, 306. This reduces the diffusion of nitrogen from the nitride material of the masking layer 306 into the silicon of the device layer 302 and causing unwanted doping of the device layer 302. The barrier layer 304, in this case, may be formed using an oxide material, such as silicon dioxide, for example. The barrier layer 304 may be formed using well-known techniques, including, for example, CVD, physical vapor deposition, sputtering, or thermal oxidation of the device layer 302. The barrier layer may have a thickness of, for example, 50 to 600 angstroms.

Figure 2B:
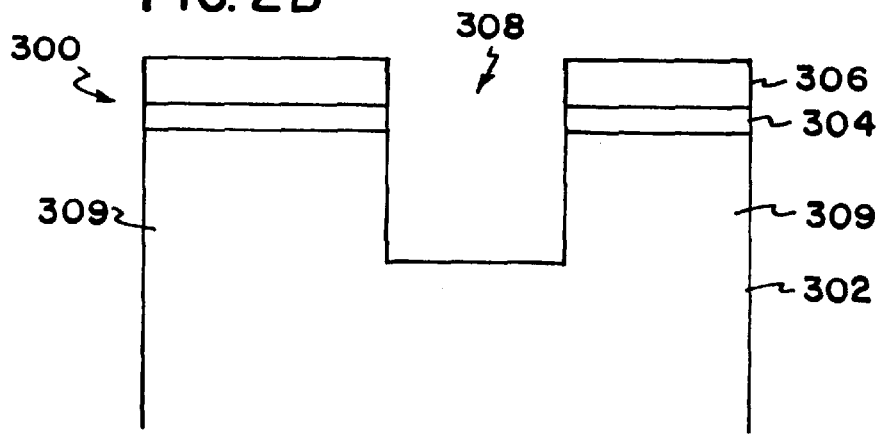

After the formation of the optional barrier layer 304 and the masking layer 306, a trench 308 may be formed in the semiconductor device 300 to separate active regions 309 in the device layer 302, as shown in FIG. 2B. The active regions may be, for example, the source and drain regions of a MOS transistor or the collector and emitter regions of a bipolar transistor.

A variety of techniques may be used to form the trench 308. One exemplary technique includes depositing a photoresist layer (not shown) over the masking layer 306; patterning the photoresist layer using a mask (not shown); and developing the photoresist layer to expose regions of the masking layer 306. This may be done using, for example, well-known photolithographic and etching techniques. The exposed regions of the masking layer 306 (and the barrier layer 304, if any) are removed to expose regions of the device layer 312. This may be done using, for example, well-known wet or dry etching techniques. Exposed regions of the device layer 302 may then be removed to form the trench 308 using, for example, well-known etching techniques, such as anisotropic plasma etching.

The trench 308 defines a trench isolation region in the device layer 302, typically between the active regions 309. Ideally, the trench 308 has straight or slightly tapered side walls with rounded edges at the bottom. However, these ideal trench attributes are not required. Typically trenches are between about 0.20 to 0.50 $\mu$m in depth, but trenches with other dimensions may also be formed.

Figure 2C:
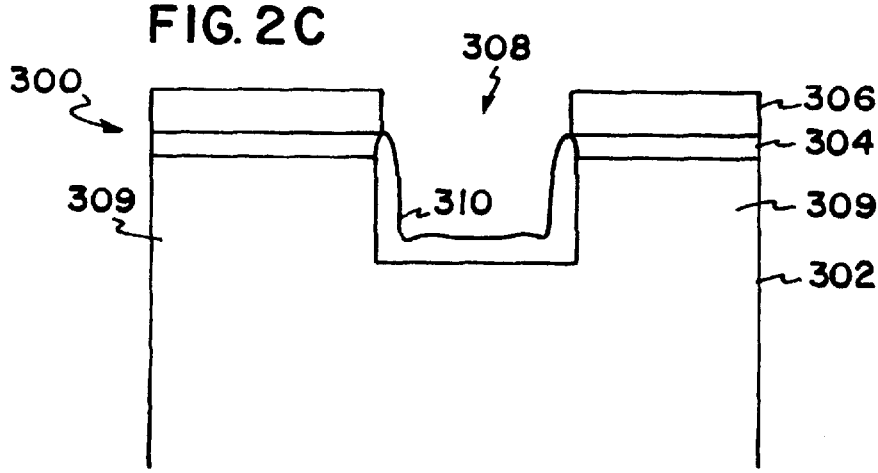
Figure 2D:
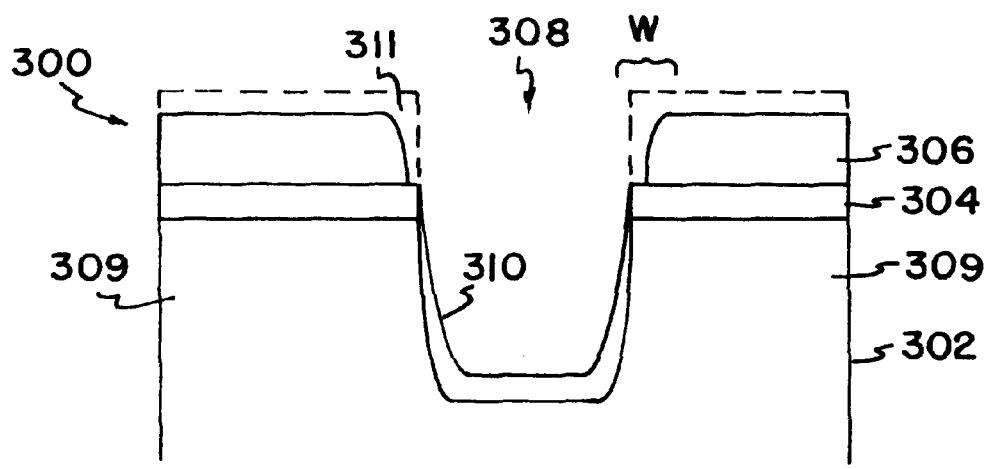

After the trench 308 is formed, a relatively thin (100 to 800 angstrom) dielectric layer 310 may be formed within the trench 308, as shown in FIG. 2C. In the illustrated embodiment, the thin dielectric layer 310 is made from a thermal oxide formed, for example, using standard thermal oxidation techniques, including, for example, the thermally controlled oxidation of the silicon substrate using gaseous $O_2$. The formation of the thin dielectric layer 310 typically may smooth the edges and corners of the trench 308. When the thin dielectric layer 310 is formed by thermal oxidation, a portion of the device layer 302 is oxidized. As a result, the sidewalls of the trench recede, as shown in FIG. 2D. In some embodiments, the thin dielectric layer may be omitted.

A portion of the masking layer 306 near the edges of the trench 308 is removed to leave an empty region 311 adjacent to the trench 308 and over a portion of the device layer 302, as shown in FIG. 2D. Typically, the process for the removal of this portion of the masking layer 306 is chosen so that very little or none of the device layer 302 is removed. This may be accomplished using well-known selective etching techniques. Etching techniques and materials (e.g., etchants that are selective to nitride if the masking layer is a nitride material) are known for accomplishing a selective etching process.

In addition to removing the portion of the masking layer 306 adjacent to the trench 308, a top portion of the masking layer 306 is also typically removed. For this reason, the masking layer 306 is typically thicker than masking layers used in other trench isolation techniques to form structures such as those illustrated in FIGS. 1A and 1B. It is often desirable that the masking layer 306 retain a sufficient thickness after this removal of material to continue to protect the underlying device layer 302 during subsequent processing, including, for example surface planarization processes such as chemical-mechanical polishing (CMP).

The removal of a portion of the masking layer adjacent to the trench 308 results in the masking layer being pulled back from its original position (shown in dashed lines). The distance between the original walls of the masking layer 306 and the remainder of the masking layer 306 after selective etching can range from, for example, 500 to 2000 angstroms at the widest point, w. This width is typically measured in a plane parallel to the surface of the device layer 302. Typically, the widest point is near the upper edge of the masking layer 306 as this edge is exposed along two sides to the etchants used to remove the portion of the masking layer 306. Near the lower edge, the masking layer 306 may, for example, be pulled back by about 100 to 1500 angstroms. The above widths are provided by way of example only and are not intended to limit the scope of the invention. The actual size of the portion of the masking layer 306 which is removed may vary depending, for example, on the subsequent processing steps and how much of the dielectric layer 312 might be removed during those steps. In some embodiments, the masking layer 306 may be pulled back by an amount which is insufficient to prevent the formation of voids during subsequent processing steps, but which is sufficient to reduce the size of the voids. This may be adequate to provide the reliability in device parameters that is needed for the completed semiconductor device.

Figure 2E:
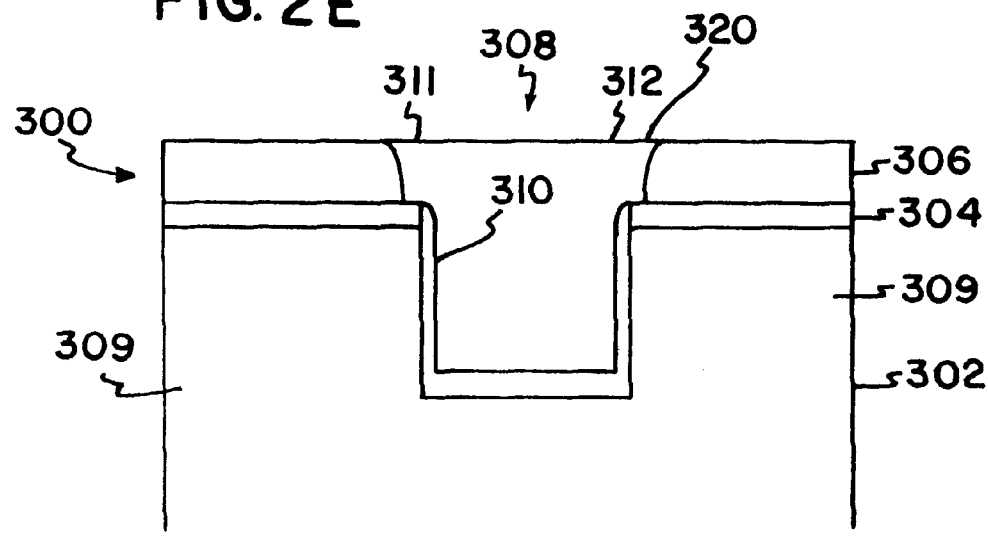

Next, the trench 308 is at least partially filled with a dielectric layer 312, as illustrated in FIG. 2E. Often, the trench is completely filled. The dielectric layer 312 may be made from a variety of dielectric materials. Suitable dielectric materials include, for example, oxides, such as silicon dioxide, or oxide-forming materials, such as hydrogen silsesquioxane (HSQ).

A variety of methods may be used to form the dielectric layer 312, including, for example, physical vapor deposition and chemical vapor deposition techniques. Typically, these methods also deposit a portion of the dielectric layer 312 over the masking layer 306. This portion of the dielectric layer 312 may be removed by a variety of techniques, including, for example, chemical polishing, mechanical polishing, or a combination thereof. The masking layer 306 is used as an etch or polish stop to indicate when a sufficient amount of the dielectric layer 312 has been removed. The removal of a portion of the dielectric layer 312 often leaves a relatively planar surface of the remainder of the dielectric layer 312 which may, at least in some embodiments, be even with, slightly above, or slightly below the surface of the masking layer 306.

The dielectric layer 312 typically also fills at least part of, and often all of, the empty regions 311 from which the portion of the masking layer 306 has been removed. This produces a trench cap 320 above the device layer 302. The trench cap 320 extends laterally beyond the walls of the trench 308 to cover adjacent portions 311 of the device layer. Thus, during subsequent processing steps, portions of the trench cap 320 may be removed without forming voids between the dielectric material 312 and the device layer 302. In some embodiments, however, the lateral overlap of the trench cap with the device layer may be sufficient to only reduce the size of the voids.

Ideally, the portion of the masking layer 306 which is removed and replaced by a portion of the dielectric layer 312 is sufficient to prevent the formation of voids during subsequent processing steps. However, this is not required.

Figure 2F:
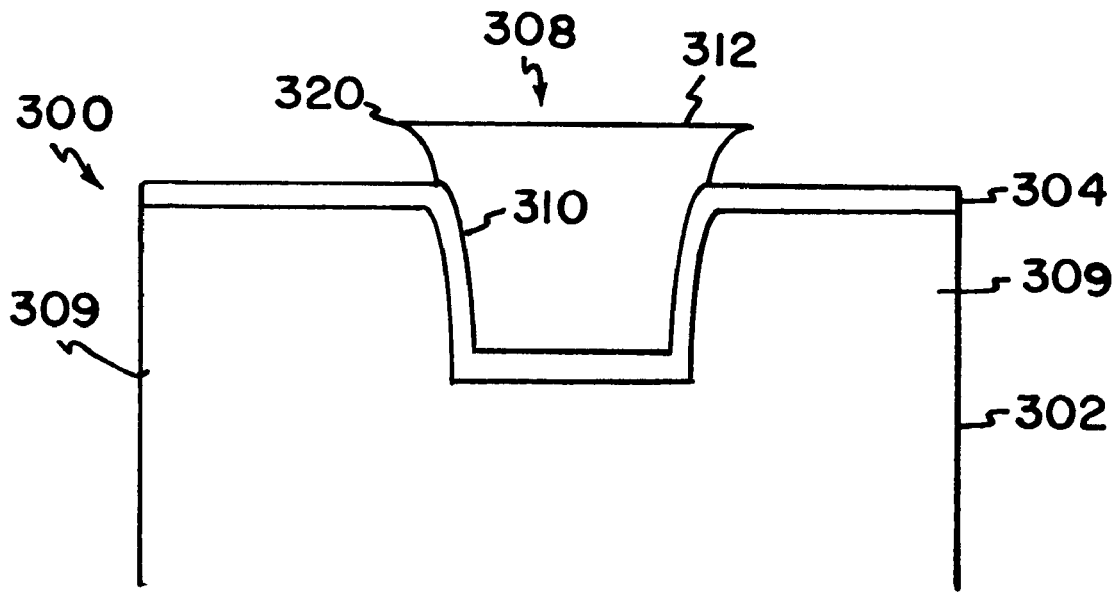
Figure 2G:
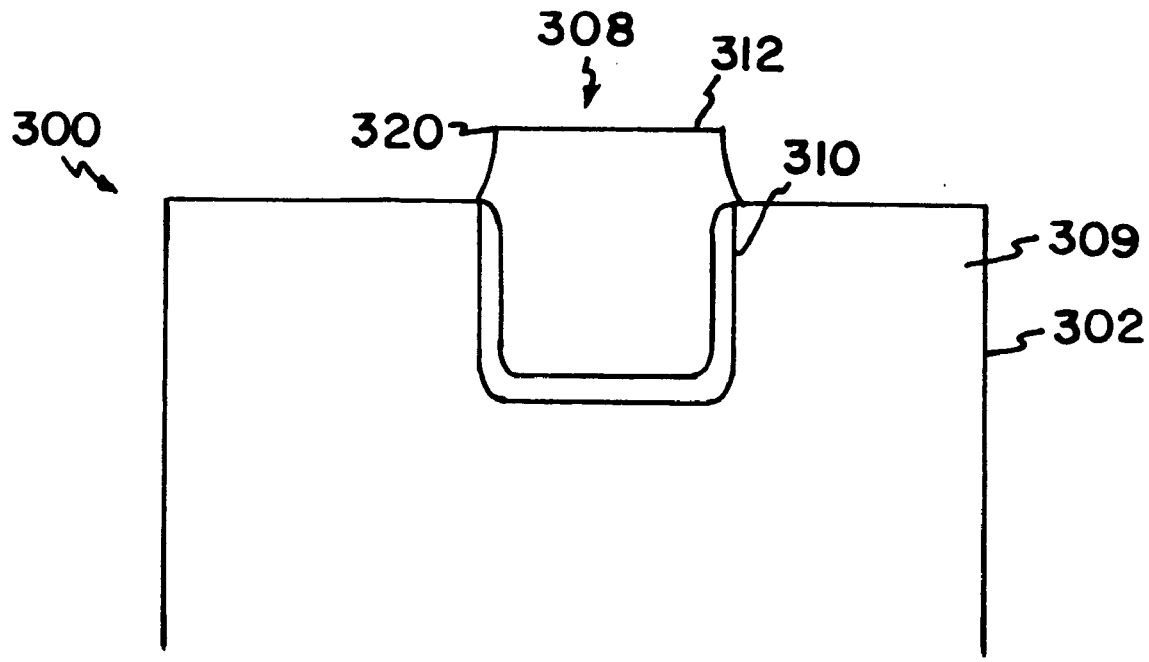

After filling the trench 308, the masking layer 306 is removed, as shown in FIG. 2F. The removal of the masking layer 306 may be performed by standard techniques including, for example, an etching process with is selective to the material of the masking layer 306. This typically leaves the trench cap 320 extending above the device layer 302. The height of the trench cap 320 above the device layer 302 is approximately the sum of the thicknesses of the barrier layer 304 and the masking layer 306 (subsequent to the removal of material in the regions 311 and the consequent decrease in masking layer thickness as illustrated in FIG. 2D).

Further processing steps may include the removal of the barrier layer 304 and other steps which remove portions of the trench cap 320. FIG. 2G illustrates a resultant structure which may be formed after removal of the barrier layer 304. However, because the trench cap extends laterally over the device layer 302, the edges of the trench cap 320 may be significantly etched without forming voids between the trench 308 and the device layer 302. In many cases, after subsequent etching of the trench cap 320, the trench cap 320 still extends over the device layer 302. However, as describe above, this is not necessary, particularly when only a reduction in the size of the voids is wanted. In such cases, the trench cap 320 may be etched so that it no longer extends over the device layer 302. The trench cap 320 still serves a function because it provides a reduction in the size of the voids which may be sufficient to avoid deleterious effects if the voids were allowed to be larger.

The present invention should not be considered limited to the particular examples described above, but rather should be understood to cover all aspects of the invention as fairly set out in the attached claims. Various modifications, equivalent processes, as well as numerous structures to which the present invention may be applicable will be readily apparent to those of skill in the art to which the present invention is directed upon review of the instant specification. The claims are intended to cover such modifications and devices.

We claim:

1. A method for producing a semiconductor device, the method comprising:

forming a masking layer over a device layer;

removing a first portion of the masking layer and an underlying portion of the device layer to form at least one trench in the device layer;

selectively removing a second portion of the masking layer from a region adjacent to the trench and above the device layer and from a top surface of the masking layer; and forming a dielectric layer in the trench, the dielectric layer at least partially filling the trench and forming a trench cap above the trench and in the region adjacent to the trench and above the device layer.

2. The method of claim 1, wherein the masking layer has a sidewall after the first portion of the masking layer is removed and the sidewall is recessed by about 500 to 2000 angstroms at a widest point after the second portion of the masking layer is removed.

3. A method for producing a semiconductor device, the method comprising:

forming a masking layer over a device layer;

removing a first portion of the masking layer and an underlying portion of the device layer to form at least one trench in the device layer;

selectively removing a second portion of the masking layer from a region adjacent to the trench and above the device layer; and forming a dielectric layer in the trench, the dielectric layer at least partially filling the trench and forming a trench cap above the trench and in the region adjacent to the trench and above the device layer;

wherein the masking layer has a sidewall after the first portion of the masking layer is removed and the sidewall is recessed by about 500 to 2000 angstroms at a widest point and by about 100 to 1500 angstroms at a narrowest point after the second portion of the masking layer is removed.

4. The method of claim 2, wherein the masking layer has an upper surface and a lower surface, the lower surface being closer to the device layer than the upper surface, wherein the widest point of the region from which the second portion of the masking layer has been removed is proximate to the upper surface of the masking layer.

5. The method of claim 1, wherein the masking layer has a thickness of 500 to 3000 angstroms prior to the second portion of the masking layer being removed.

6. The method of claim 5, wherein the masking layer has a thickness of 500 to 2000 angstroms subsequent to the second portion of the masking layer being removed.

7. The method of claim 1, further comprising removing the masking layer.

8. The method of claim 1, wherein removing a first portion of the masking layer and the device layer comprises removing the first portion of the masking layer to expose a region of the device layer, and removing a portion of the device layer in the exposed region to define the trench.

9. The method of claim 8, wherein removing a portion of the device layer comprises anisotropically etching a portion of the device layer.

10. The method of claim 1, further comprising forming a barrier layer over the device layer prior to forming the masking layer.

11. The method of claim 10, further comprising removing the barrier layer.

12. The method of claim 1, further comprising forming a thin dielectric layer within the trench prior to forming the dielectric layer.

13. The method of claim 1, wherein the device layer is a substrate of the semiconductor device.

14. The method of claim 1, wherein the device layer comprises silicon.

15. The method of claim 1, wherein the dielectric layer comprises an oxide material.

16. The method of claim 15, wherein the oxide material comprises silicon dioxide.

17. The method of claim 1, wherein the masking layer comprises a nitride material.

18. A method of isolating active regions of a semiconductor device, the method comprising:

forming a nitride masking layer over the device layer;

removing a first portion of the nitride masking layer to expose an isolation region of the device layer, a remaining portion of the nitride masking layer defining at least two active regions of the device layer;

removing a portion of the exposed device layer to form at least one trench in the device layer between the at least two active regions;

selectively removing a second portion of the nitride masking layer from a region adjacent to the trench and above the device layer; and forming a dielectric layer in the trench and directly over the nitride masking layer, the dielectric layer at least partially filling the trench and the region adjacent to the trench and above the device layer, the dielectric layer forming a trench cap which extends laterally over a portion of the device layer.

19. A method for producing a semiconductor device, the method comprising:

forming a patterned masking layer exposing at least one portion of a substrate;

etching the exposed portion of the substrate to form a trench in the substrate;

removing a portion of the patterned masking layer to form a recess between the trench and the patterned masking layer, the recess having a non-uniform width; and filling at least a part of the trench and the recess with a dielectric material.

20. The method of claim 1, wherein selectively removing a second portion of the masking layer comprises selectively removing a second portion of the masking layer from a region adjacent to the trench and above the device layer and from the top surface of the masking layer, wherein at least a portion of the top surface of the masking layer is exposed prior to selectively removing the second portion of the masking layer.

* * * * *